US006977819B2

(12) United States Patent
Bertram et al.

(10) Patent No.: US 6,977,819 B2
(45) Date of Patent: Dec. 20, 2005

(54) APPARATUS AND METHOD FOR ELECTRICALLY COUPLING A BEZEL

(75) Inventors: Thomas J. Bertram, Phoenix, AZ (US); Patrick J. Richardson, Tempe, AZ (US); Suzanne M. Wong, Tempe, AZ (US)

(73) Assignee: Motorola, Inc., Schaumburg, IL (US)

( * ) Notice: Subject to any disclaimer, the term of this patent is extended or adjusted under 35 U.S.C. 154(b) by 230 days.

(21) Appl. No.: 09/957,999

(22) Filed: Sep. 21, 2001

(65) Prior Publication Data

US 2003/0058600 A1    Mar. 27, 2003

(51) Int. Cl.⁷ .......................... H05K 5/00; H05K 5/04; H05K 5/06
(52) U.S. Cl. ..................... 361/730; 361/728; 361/800; 361/816; 361/818
(58) Field of Search ............................... 361/760, 748, 361/736, 752, 753, 727–731, 737, 818, 816, 361/800, 756, 796, 759; 174/35 R

(56) References Cited

U.S. PATENT DOCUMENTS

| | | | | |
|---|---|---|---|---|
| 4,575,578 A | * | 3/1986 | Bogan et al. ........... 174/35 GC |
| 5,083,239 A | * | 1/1992 | Sedlemeier et al. ........ 361/816 |
| 5,251,109 A | * | 10/1993 | Baitz .......................... 361/796 |
| 5,252,782 A | * | 10/1993 | Cantrell et al. ........... 174/35 R |
| 5,264,986 A | * | 11/1993 | Ohgami et al. ............. 361/685 |
| 5,313,371 A | * | 5/1994 | Knecht et al. .............. 361/818 |
| 5,564,930 A | * | 10/1996 | Yu ............................... 439/61 |
| 5,650,922 A | * | 7/1997 | Ho ............................. 361/799 |
| 5,704,117 A | * | 1/1998 | Mok et al. .................... 29/841 |
| 5,825,634 A | * | 10/1998 | Moorehead, Jr. .......... 361/816 |
| 5,838,550 A | * | 11/1998 | Morris et al. ............... 361/818 |
| 5,975,953 A | * | 11/1999 | Peterson .................... 439/607 |
| 6,058,025 A | * | 5/2000 | Ecker et al. ................ 361/816 |
| 6,278,617 B1 | * | 8/2001 | Yang et al. ................. 361/818 |
| 6,403,879 B1 | * | 6/2002 | Clements et al. ...... 174/35 GC |
| 6,508,653 B2 | * | 1/2003 | Malone et al. ............... 439/92 |
| 6,551,117 B2 | * | 4/2003 | Poplawski et al. ........... 439/92 |
| 6,575,619 B1 | * | 6/2003 | Stauffer ...................... 368/299 |
| 6,597,581 B2 | * | 7/2003 | Barringer et al. .......... 361/756 |
| 6,603,657 B2 | * | 8/2003 | Tanzer et al. .............. 361/685 |
| 6,618,271 B1 | * | 9/2003 | Erickson et al. ........... 361/818 |

* cited by examiner

Primary Examiner—Amir Zarabian
Assistant Examiner—Thanh Y. Tran
(74) Attorney, Agent, or Firm—Kevin D. Wills

(57) ABSTRACT

An apparatus including a front panel (102) and a bezel (104) coupled to the front panel (102) and having a gasket (110), where the gasket (110) is affixed to the bezel (104) and electrically couples the bezel (104) to the front panel (102). Bezel (104) can be a mezzanine card bezel, a common mezzanine card bezel, and the like. A method of electrically coupling a front panel (102) to a bezel (104) includes providing a front panel (102) having an inner surface (112) defining a cut-out (114). Also, providing a bezel (104) having a perimeter (118), where the inner surface (112) of the cut-out (114) is designed to receive the bezel (104). Affixing a gasket (110) to the perimeter (118) of bezel (104) an the inner surface (112) receiving the bezel (104) where the gasket (110) is designed to be coupled to the inner surface (112), and electrically coupling the bezel (104) to the front panel (102) through the gasket (110).

19 Claims, 3 Drawing Sheets

APPARATUS AND METHOD FOR ELECTRICALLY COUPLING A BEZEL

BACKGROUND OF THE INVENTION

In order for electronic equipment to be electromagnetically compatible with each other, electromagnetic energy from one piece of equipment must not adversely affect the operation of other electronic equipment. Successful Electromagnetic Compatibility (EMC) relies on a combination of decreasing emissions from equipment that is producing electromagnetic energy and increasing the immunity of equipment that is receiving electromagnetic energy. Effective EMC design is critical to commercial success of electronic equipment since strict EMC requirements are imposed in most locations.

Many host boards in computers have a front panel with one or more cut-outs for input/output (I/O) connectors and some have cut-outs for mezzanine boards and their associated (I/O) connectors. Each mezzanine board generally includes a bezel designed to fit in the cut-out in the host board front panel. In order to meet EMC requirements, it is essential that there be good electrical contact between the host board front panel and the bezel. In prior art schemes, various gasket types were friction-fitted around the bezel. One disadvantage of these methods is that gaskets typically "roll off" of the bezel when the bezel is installed. Another disadvantage is that gasket size and stiffness often cause the front panel to bow when the mezzanine board and bezel are installed. Yet another disadvantage is that prior art gasket schemes often use gasket materials of high electrical resistivity, which cause electromagnetic leakage around the bezel/front panel interface thereby increasing electromagnetic energy leakage. This leads to electronic devices often failing EMC requirements and rendering some electronic devices inadequate for certain electromagnetically sensitive areas.

Accordingly, there is a significant need for an apparatus and method of electrically coupling a bezel to a front panel that overcomes the deficiencies of the prior art outlined above.

BRIEF DESCRIPTION OF THE DRAWINGS

Referring to the drawing.

Figure 2:
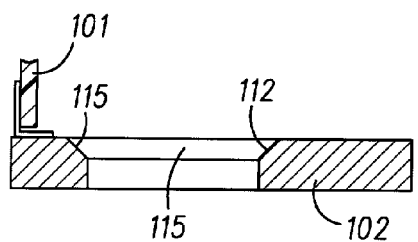
FIG. 2 is a cross-section of front panel from section 2—2 of FIG. 1 according to an embodiment of the invention.

It will be appreciated that for simplicity and clarity of illustration, elements shown in the drawing have not necessarily been drawn to scale. For example, the dimensions of some of the elements are exaggerated relative to each other. Further, where considered appropriate, reference numerals have been repeated among the Figures to indicate corresponding elements.

DESCRIPTION OF THE PREFERRED EMBODIMENTS

In the following detailed description of exemplary embodiments of the invention, reference is made to the accompanying drawings (where like numbers represent like elements), which form a part hereof, and in which is shown by way of illustration specific exemplary embodiments in which the invention may be practiced. These embodiments are described in sufficient detail to enable those skilled in the art to practice the invention, but other embodiments may be utilized and logical, mechanical, electrical and other changes may be made without departing from the scope of the present invention. The following detailed description is, therefore, not to be taken in a limiting sense, and the scope of the present invention is defined only by the appended claims.

In the following description, numerous specific details are set forth to provide a thorough understanding of the invention. However, it is understood that the invention may be practiced without these specific details. In other instances, well-known circuits, structures and techniques have not been shown in detail in order not to obscure the invention.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact. However, "coupled" may also mean that two or more elements are not in direct contact with each other, but yet still co-operate or interact with each other.

Figure 1:
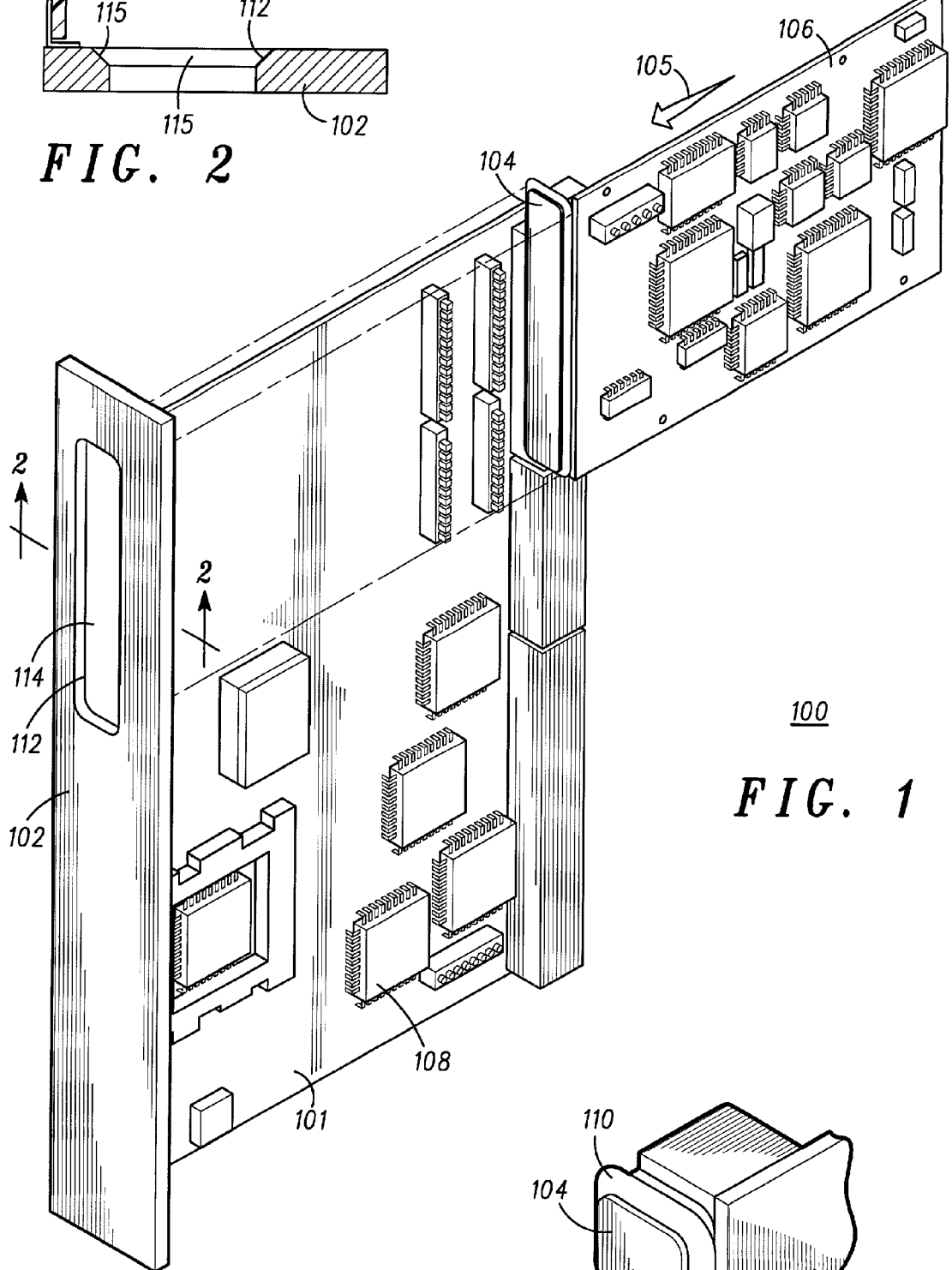
FIG. 1 is an isometric of an electronics module.

FIG. 1 is an isometric of an electronics module 100. As shown in FIG. 1, electronics module 100 can include a host board 101, such as a motherboard, removable circuit board, and the like, which couples to and operates with a computer or other electronic device (not shown for clarity). In another embodiment, electronics module 100 can itself be the computer or other electronic device. Included on electronics module 100 are one or more components 108. In an embodiment of the invention, component 108 can be a processor, application specific integrated circuit (ASIC) such as random access memory (RAM), and the like.

In the embodiment shown in FIG. 1, electronics module 100 and host board 101 have a front panel 102. Electronics module 100 may also include one or more mezzanine boards 106 and their associated bezel 104. In general, mezzanine boards 106 are deployed on a variety of electronics modules 100 to provide front panel input/output (I/O), additional functionality, and the like. Mezzanine board 106 is designed to be coupled to host board 101 as shown by arrow 105. Although any type of mezzanine board 106 is within the scope of the invention, an exemplary embodiment may be a Common Mezzanine Card (CMC) as specified and set forth in the Institute of Electrical and Electronics Engineers (IEEE) standard P1386, which is herein incorporated by reference. A particular example of an embodiment is a peripheral component interconnect PCI mezzanine card, also known as a PMC. The mezzanine card, which fits into a PMC site is known as a PMC module. The parameters and specifications of a PMC module, including physical dimensions, number of connectors, location of connectors, electrical specifications, and the like, are also specified in IEEE standard P1386.

In order to provide front panel 102 I/O functionality, mezzanine board 106 includes a bezel 104, which may be connected to mezzanine board 106. Bezel 104 and mezzanine board 106 can include one or more connectors (not shown for clarity) for I/O interfacing with electronic devices external to electronics module 100. Connectors can be electrical connectors, optical connectors, and the like, known to those skilled in the art. Bezel 104 usually consists of a material with high electrical conductivity, for example, zinc diecast alloys, extruded/machined aluminum alloys, and the like. Bezel 104 can be a mezzanine board bezel, a common mezzanine card bezel, a PMC bezel, and the like.

In FIG. 1, host board 101 and mezzanine board 106 are shown separately with front panel 102 of host board 101 having an inner surface 112, which defines a cut-out 114. Bezel 104 is designed to be received in cut-out 114.

FIG. 2 is a cross-section of front panel 102 from section 2—2 of FIG. 1 according to an embodiment of the invention. Inner surface 112 of front panel can have a chamfer 115 associated with it to ease insertion of bezel 104 into cut-out 114 of front panel.

Figure 3:
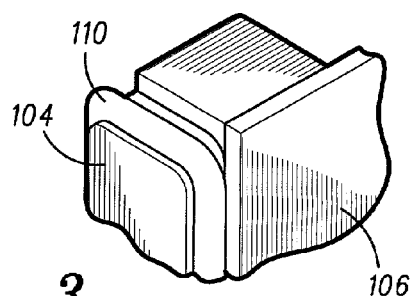
FIG. 3 is an enlarged portion of the corner of bezel 104 illustrated gasket 110.

FIG. 3 is an enlarged portion of the corner of bezel 104 illustrating gasket 110. When bezel 104 is coupled to front panel 102, gasket 110 is designed to electrically couple bezel 104 to front panel in order to minimize electromagnetic radiation from electronics module 100 and mezzanine board 106 and generally electromagnetically seal front panel 102 and bezel 104. Gasket 110 is also designed to prevent surrounding electromagnetic sources from interfering with the operation of host board 101 and mezzanine board 106.

Figure 4:
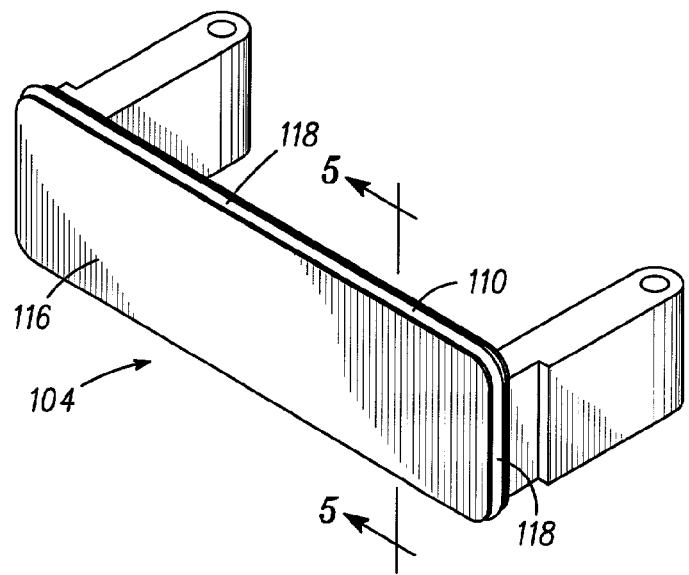
FIG. 4 is an isometric view of bezel according to an embodiment of the invention.
Figure 6:
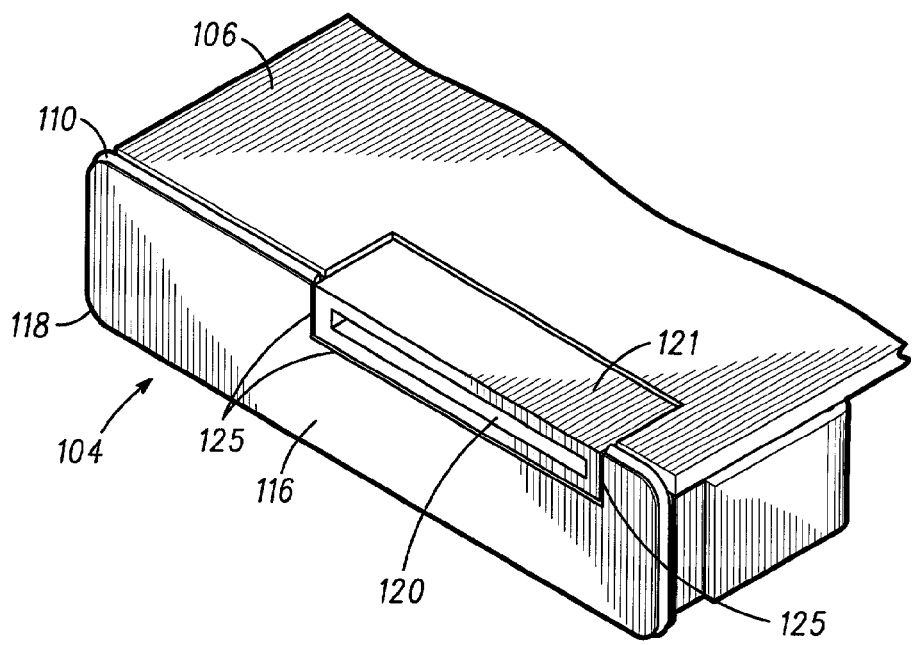
FIG. 6 depicts a bezel with three inner surfaces that define a connector notch according to an embodiment of the invention.

FIG. 4 is an isometric view of bezel 104 according to an embodiment of the invention. As shown in FIG. 3, bezel 104 includes a face 116 and a perimeter 118 around face 116. One or more connectors (not shown) can be included in face 116 of bezel to provide I/O functionality. In one embodiment, one or more connectors are entirely within perimeter 118 of bezel 104. In another embodiment, as shown in FIG. 6 below, connector can impinge on perimeter 118. In an embodiment of the invention, gasket 110 is affixed to perimeter 118 and continuous around perimeter 118. In another embodiment, gasket 110 is discontinuous around perimeter 118, as will be shown in FIG. 6 below.

Figure 5:
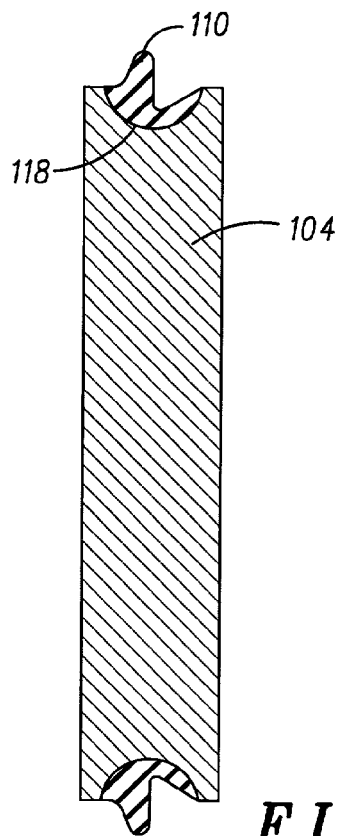
FIG. 5 is a cross-section of a bezel from section 5—5 of FIG.4 according to an embodiment of the invention.

FIG. 5 is a cross-section of a bezel 104 from section 5—5 of FIG. 4 according to an embodiment of the invention. As shown in FIG. 5, perimeter 118 has a semicircular cross-section. However, this is not meant to be limiting, and any cross-section of perimeter 118 is within the scope of the invention. For example, perimeter 118 can have a triangular cross-section, an irregular cross-section, a semicircular cross-section with regular or irregular edges, and the like.

Gasket 110 is affixed to perimeter 118 of bezel 104, unlike prior art schemes where gasket 110 is merely friction-fit. When gasket 110 is affixed to bezel 104, gasket 110 becomes an integral part of bezel 104. The purpose of gasket 110 is to provide electrical conductivity between front panel 102 and bezel 104 in order to minimize electromagnetic energy generated by one or more components 108 from escaping and interfering with other electronic devices. Another purpose is to prevent surrounding electromagnetic energy from interfering with the operation of any portion of electronics module 100. In an embodiment of the invention, gasket 110 is comprised of an electrically conductive material, for example, a metal impregnated elastomer. In an example of an embodiment of the invention, gasket 110 is comprised of silver-plated copper in silicone, which is available under the trade name CHO-SEAL 1273™ as manufactured by Chomerics, a division of Parker Hannifin Corporation, 77 Dragon Court, Woburn, Mass. 01888. In a preferred embodiment of the invention, gasket 110 has a resistivity of less than 0.005 ohm-cm. It should be understood that the gasket materials above do not limit the invention, and that any gasket materials that are conductive are within the scope of the invention.

Gasket 110 can be affixed to bezel 104 by a variety of methods. For example, gasket 110 can be bonded to bezel 104 through the use of adhesives known to one skilled in the art. In another embodiment, gasket 110 can be molded to bezel 104. As an example, bezel 104 can be placed in a mold, and perimeter 118 coated with an electrically conductive primer. Thereafter, gasket, preferably a metal impregnated elastomer gasket, is molded to perimeter 118 of bezel, thereby becoming an integral part of bezel 104. In one embodiment of the invention, electrically conductive primer can be silicone in solvent. As an example, and without limitation, silicone in solvent may be a methyl isobutyl ketone based primer. An example of a methyl isobutyl ketone based primer is Dow Corning® 3-6060 Prime Coat as manufactured by Dow Corning Corporation, South Saginaw Road, Midland, Mich. 48686. The methods and material for affixing gasket 110 to bezel disclosed above are not limiting of the invention. Other methods, processes and materials for affixing gasket 110 to bezel 104 are within the scope of the invention.

The gasket depicted in FIG. 5 has a cross-section designed to interface with front panel 102 cut-out 114 and has the advantage of providing a form-fit between gasket 110 and inner surface 112 of front panel 102 in order to minimize electromagnetic energy passage as described above. The cross-section of gasket 110 depicted in FIG. 5 is only one embodiment of the invention. Other cross-sections, for example, circular, star-shaped, saw-toothed, and the like, are within the scope of the invention.

FIG. 6 depicts a bezel 104 with three inner surfaces 125 that define a connector notch 120 according to an embodiment of the invention. As shown in FIG. 6, connector notch 120 in the face 116 of bezel 104 impinges on perimeter 118. Connector notch 120 is designed to accommodate connector 121, which impinges perimeter 118. In the embodiment depicted in FIG. 6, gasket 110 is discontinuous at connector notch 120. The invention has the advantage that an affixed gasket 110 can accommodate an oversized or offset connector 121 and connector notch 120 that impinges perimeter 118 and creates a discontinuity in gasket 110. Prior art friction-fit schemes of bezel gaskets were ineffective in these configurations.

Figure 7:
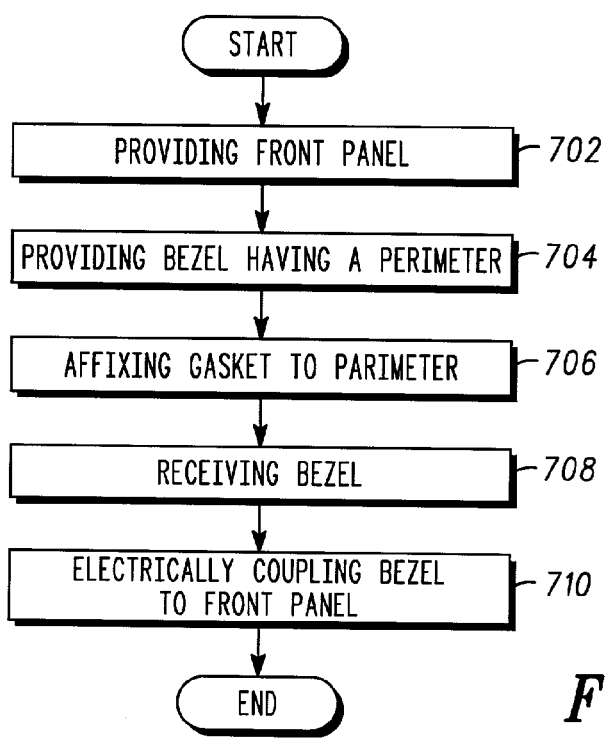
FIG. 7 is a flow chart of an embodiment of the invention.

FIG. 7 is a flow chart of an embodiment of the invention. FIG. 7 depicts a method of electrically coupling a front panel 102 to a bezel 104. In step 702, a front panel 102 is provided, which has an inner surface 112 defining a cut-out 114. In step 704, a bezel 104 having a perimeter 118 is provided, where inner surface 112 of front panel 102 defining cut-out 114 is designed to receive bezel 104.

In step 706, gasket 110 is affixed to perimeter 118 of bezel 104 through means such as bonding, molding, and the like, discussed above. In step 708, inner surface 112 of cut-out 114 receives bezel 104, where gasket 110 is designed to be coupled to inner surface 112. In step 710, gasket 110 electrically couples bezel 104 to front panel 102. In other words, there is created a highly conductive path for electricity from front panel 102 to bezel 104 and vice-versa.

The apparatus and method of the invention have the advantage of creating an electrically conductive seal between a host board's front panel and a bezel. Another advantage of the invention is that it prevents gasket roll-out when a mezzanine board is installed into a host board. Yet another advantage is that the invention allows the use of larger connector notches in a bezel, and allows connector notches to overlap with the perimeter of the bezel. Yet another advantage is that gasket cross-section design flexibility is greatly improved since gasket cross-section is no longer limited to round shape and can be shaped to allow a better fit and a greater electrically conductive seal. Still another advantage of the invention is that EMC requirements are more reliably achieved due to the enumerated advantages listed above. Still yet another advantage of the invention is the gasket, which is designed to alleviate insertion force on the front panel during installation of the mezzanine card.

While we have shown and described specific embodiments of the present invention, further modifications and improvements will occur to those skilled in the art. It is therefore, to be understood that appended claims are intended to cover all such modifications and changes as fall within the true spirit and scope of the invention.

What is claimed is:

1. In an electronics module, an apparatus, comprising:
a host board;
a front panel coupled to the host board; and
a mezzanine board bezel, wherein the front panel is coupled to receive the mezzanine board bezel, wherein the mezzanine board bezel is coupled to the front panel and having an integrally affixed gasket, wherein the gasket is integrally molded or chemically bonded to the bezel, wherein the integrally affixed gasket is an integral part of the bezel, and wherein the gasket electrically couples the mezzanine board bezel to the front panel.

2. The apparatus of claim 1, wherein the integrally affixed gasket is molded to the mezzanine board bezel.

3. The apparatus of claim 1, wherein the integrally affixed gasket is bonded to the mezzanine board bezel.

4. The apparatus of claim 1, wherein the integrally affixed gasket is a metal impregnated elastomer.

5. The apparatus of claim 4, wherein the metal impregnated elastomer comprises silver-plated copper in silicone.

6. The apparatus of claim 4, wherein the metal impregnated elastomer has a resistivity less than 0.005 ohm-cm.

7. An apparatus, comprising:
a mezzanine board bezel having a surface and a perimeter, wherein the mezzanine board bezel is designed to be coupled to a mezzanine board; and
an integrally affixed gasket integrally affixed to the perimeter, wherein the integrally affixed gasket is integrally molded or chemically bonded as an integral part of the bezel, wherein the gasket is designed to electrically couple the mezzanine board bezel to a front panel.

8. The apparatus of claim 7, wherein the mezzanine board bezel comprises a connector notch in the surface, and wherein the connector notch impinges on the perimeter of the mezzanine board bezel.

9. The apparatus of claim 8, wherein the integrally affixed gasket is discontinuous at the connector notch.

10. The apparatus of claim 7, wherein the integrally affixed gasket is continuous around the perimeter of the mezzanine board bezel.

11. The apparatus of claim 7, wherein the integrally affixed gasket is molded to the mezzanine board bezel.

12. The apparatus of claim 7, wherein the integrally affixed gasket is bonded to the mezzanine board bezel.

13. An apparatus, comprising:
a front panel having an inner surface defining a cut-out;
a mezzanine board bezel having a perimeter, wherein the inner surface defining the cut-out out is designed to receive the mezzanine board bezel; and
an integrally affixed gasket integrally affixed to the perimeter of the mezzanine board bezel, wherein the integrally affixed gasket is designed to be coupled to the inner surface of the front panel, wherein the integrally affixed gasket is integrally molded or chemically bonded as an integral part of the bezel, and wherein the gasket electrically couples the mezzanine board bezel to the front panel.

14. The apparatus of claim 13, wherein the mezzanine board bezel comprises a connector notch, and wherein the connector notch impinges on the perimeter of the mezzanine board bezel.

15. The apparatus of claim 14, wherein the integrally affixed gasket is discontinuous at the connector notch.

16. The apparatus of claim 13, wherein the intently affixed gasket is continuous around the perimeter of the mezzanine board bezel.

17. In an electronics module, a method of electrically coupling a front panel to a mezzanine board bezel, comprising:
providing the front panel having an inner surface defining a cut-out;
providing the mezzanine board bezel having a perimeter, wherein the inner surface defining the cut-out is designed to receive the mezzanine board bezel;
affixing an integrally affixed gasket to the perimeter of the mezzanine board bezel, wherein the integrally affixed gasket is integrally molded or chemically bonded as an integral part of the bezel;
the inner surface of the cut-out receiving the mezzanine board bezel, wherein the integrally affixed gasket is designed to be coupled to the inner surface; and electrically coupling the mezzanine board bezel to the front panel trough the integrally affixed gasket.

18. The method of claim 17, wherein affixing the integrally affixed gasket comprises molding the gasket to the mezzanine board bezel.

19. The method of claim 17, wherein affixing the integrally affixed gasket comprises bonding the gasket to the mezzanine board bezel.

* * * * *